United States Patent [19]

Tseng

[11] Patent Number: 5,741,741
[45] Date of Patent: Apr. 21, 1998

[54] METHOD FOR MAKING PLANAR METAL INTERCONNECTIONS AND METAL PLUGS ON SEMICONDUCTOR SUBSTRATES

[75] Inventor: Horng-Huei Tseng, Hsinchu, Taiwan

[73] Assignee: Vanguard International Semiconductor Corporation, Hsin-Chu, Taiwan

[21] Appl. No.: 652,175

[22] Filed: May 23, 1996

[51] Int. Cl.$^6$ .................................................. H01L 21/44
[52] U.S. Cl. ..................... 438/637; 438/666; 438/672; 438/700
[58] Field of Search ..................... 437/192, 194, 437/195, 203, 228; 156/643.1; 438/672, 637, 700, 666

[56] References Cited

U.S. PATENT DOCUMENTS

| | | |
|---|---|---|
| 4,789,648 | 12/1988 | Chow et al. |
| 4,944,836 | 7/1990 | Beyer et al. ............................ 156/645 |
| 5,017,509 | 5/1991 | Tuckerman ............................ 437/195 |
| 5,290,731 | 3/1994 | Sugano et al. ........................ 437/174 |
| 5,354,711 | 10/1994 | Heitzmann et al. .................. 437/182 |

OTHER PUBLICATIONS

K. Ueno, "A Half–Micron Pitch Cu Interconnection Technology" IEEE 1995 Symposium on VLSI Technology Digest of Technical Papers, pp. 27–28.

*Primary Examiner*—Caridad Everhart
*Attorney, Agent, or Firm*—George O. Saile; Stephen B. Ackerman

[57] ABSTRACT

A method for making planar metal interconnections and T-shaped metal plugs for integrated circuits is achieved. The method involves forming a planar insulating ($SiO_2$) and a hard mask film over a first level of interconnections. A patterned first photoresist layer is then formed for etching trenches in the hard mask film and partially into the planar insulating layer ($SiO_2$) in which a second level of interconnections are to be formed. The patterned photoresist layer is then laterally etched to expose the hard mask adjacent to the trenches in the $SiO_2$, and the hard mask is then removed adjacent to the trenches to form a self-aligned mask for the metal plug contact openings. A patterned second photoresist mask aligned over the trenches is then used to etch the contact openings in the trenches, using the hard mask to form T-shaped plug contact openings to the first level of interconnections. The trenches and plug contact openings are concurrently filled with CVD aluminum and chem/mech polished back to form the second level of interconnections with T-shaped metal plugs. The T-shaped metal plugs improve the edge coverage while making it easier to fill the narrow contact openings with aluminum without voids in the metal plugs.

24 Claims, 5 Drawing Sheets

METHOD FOR MAKING PLANAR METAL INTERCONNECTIONS AND METAL PLUGS ON SEMICONDUCTOR SUBSTRATES

BACKGROUND OF THE INVENTION

(1) Field of the Invention

The present invention relates to a method for making planar metal interconnections and metal plug structures for integrated circuits on semiconductor substrates, and more particularly relates to a method for forming metal interconnections with T-shaped metal plugs having improved step coverage. The interconnections and plugs are coplanar with the insulating surface.

(2) Description of the Prior Art

The integrated circuits formed on semiconductor substrates for Ultra Large Scale Integration (ULSI) require multilevels of metal interconnections for electrically interconnecting the discrete semiconductor devices on the semiconductor chips. The different levels of interconnections are separated by layers of insulating material. These interposed insulating layers have etched via holes which are used to connect one level of metal to the next. Unfortunately, the compounding effect of depositing and patterning the metal layers, one layer over another, results in an irregular or substantially non-planar surface on an otherwise microscopically planar substrate. As the number of metal levels increases, the rough topography becomes substantially worse. Downscaling of devices on ULSI circuits and the formation of the interconnecting metal wiring over the rough topography result in several processing problems. For example, advances in photolithographic resolution require a more shallow depth of focus (DOF) during exposure of the photoresist, and result in unwanted distortion of the photoresist images when the photoresist is exposed over the rough topography. Another problem occurs during anisotropic etching to pattern the metal layer. Removing the metal over steps in rough topography is difficult because of the directional nature of the anisotropic plasma etch. This can result in intralevel shorts (stringers) between the closely spaced metal lines. And, further, thinning of the metal over the steps in the rough topography during the metal deposition can lead to localized high current density in the patterned metal lines which results in electromigration of metal atoms. This results in voids in the metal lines at the step, leading to electrically open lines, and also to metal extrusions that can result in electrical shorts between the metal lines.

One approach to circumventing these topographic problems is to provide an essentially planar insulating layer on which the metal is deposited and patterned. This planar surface is particularly important as the number of levels in the multilevel increases and the rough topography becomes more severe. Various methods have been employed to achieve a more planar insulating layer. For example, on the semiconductor substrate surface, it is common practice to use a chemical vapor deposition (CVD) to deposit a low-melting-temperature glass, such as phosphosilicate glass (PSG) or borophosphosilicate glass (BPSG), and then thermally annealing the glass to form a more planar surface. At the multilayer metal level, where even lower temperature processing is required, biased plasma enhanced CVD (PECVD) or sputter deposition can be used. Another approach is to deposit a CVD oxide and etch-back or use chemical/mechanical polishing (CMP) to planarize the surface. Still other approaches include coating the substrate with a spin-on-glass (SOG) layer and then applying etch-back techniques to planarize the layers. It is also now common practice in the semiconductor industry to employ metal plugs in the contact openings to the substrate, and in the via holes etched in the insulating layer between metal layers, to further improve the planarity and to improve the reliability. For example, one method of forming planar multilayer structures is described by Chou et al., U.S. Pat. No. 4,789,648. Chou's method utilizes two insulating layers having a patterned etch-stop layer between the two insulating layers for forming self-aligned via holes to the underlying metal level. The top insulating layer is etched to form recesses in which the next level of metal lines are to be formed. The etching is continued using the etch-stop layer to pattern the bottom insulating layer for making the via holes. Chou's method then deposits a conformal metal layer which is then chem/mech polished (CMP) to the surface of the top insulating layer to concurrently form patterned metal lines in channels (trenches) and metal plugs in the via holes. Another method for making a planar multilayer interconnection using copper is described by K. Ueno et al. in IEEE 1995 Symposium on VLSI Technology Digest of Technical Papers, pages 27–28. In Ueno's paper, a first insulating layer having an etch-stop layer on the surface is patterned to form trenches for the interconnecting metal. Then, a second photoresist layer is used to form the contact (or via) holes while using the etch-stop layer to self-align the contact holes to the trenches. After removing the photoresist, a copper CVD is deposited and chem/mech polished back to the insulating layer to form the planar copper interconnections and copper plugs.

There is still a need in the semiconductor industry for providing a simplified method for concurrently forming planar metal interconnections with self-aligned metal plugs having improved step coverage, and providing a more cost-effective manufacturing process with improved reliability.

SUMMARY OF THE INVENTION

A principal object of the present invention is to provide an improved method for concurrently forming planar multilevel metal interconnections with self-aligned metal plugs having improved step coverage.

It is another object of this invention to provide these multilevel interconnections and self-aligned plugs in a single insulating layer.

It is a further object of this invention to self-align the T-shaped metal plugs to the metal interconnections using a self-aligned hard mask on the insulating layer.

In summary, this invention provides a method for forming planar metal interconnections and T-shaped metal plugs for multilevel interconnections on a substrate. More specifically, the method is used for forming the electrical connections for wiring up the discrete devices on semiconductor substrates to form ULSI circuits.

The invention begins by providing a semiconductor substrate. The most commonly used substrate in the semiconductor industry is composed of single crystal silicon. However, the method is also applicable to other types of substrates where electrical interconnections are desirable. Typically the semiconductor substrate contains electrically isolated device areas in which the semiconductor devices are formed. A first insulating layer is deposited on the substrate to electrically insulate the devices, and contact openings etched in the first insulating layer provide for electrical contact to the terminals of the semiconductor devices fabricated in the device areas. A first conducting layer is deposited next, and is patterned using conventional photolithographic techniques and plasma etching to provide the first level of electrical interconnections to the devices. Typically the first level of interconnections is patterned from a doped polysilicon layer or a polycide layer (doped polysilicon/refractory metal silicide). Although polysilicon or polycide are commonly used, in some circuit applications, such as CMOS, DRAM, SRAM, and like circuits, the first level of interconnections can also be composed of a metal such as aluminum (Al) or an aluminum alloy containing copper and/or silicon. Usually a barrier metal layer is deposited over the device contacts prior to depositing the Al to prevent aluminum spiking into the silicon contact areas. The method continues by depositing over the first level of interconnections a second insulating layer, preferably composed of chemical vapor deposited (CVD) silicon oxide ($SiO_2$). The second insulating layer is then chemical/mechanically polished to provide a planar surface, and a hard-mask film is deposited which later serves as a patterned etch mask for etching the second insulating layer. Preferably the hard-mask material is composed of amorphous silicon and alternatively silicon nitride ($Si_3N_4$) or polysilicon can also be used. A first photoresist layer is now deposited on the hard-mask film by conventional spin coating. This first photoresist layer is also patterned using conventional photolithographic techniques to provide open regions over areas where the interconnecting metal lines will later be formed in trenches recessed into the planar second insulating layer. The first photoresist layer is patterned having vertical sidewalls. Using the first photoresist layer as a mask, anisotropic plasma etching is used to remove the hard-mask film in the photoresist openings, and to etch partially into the second insulating layer, thereby forming trenches with vertical sidewalls in which the second level of metal interconnecting lines are to be formed. A key feature of this invention is that the first photoresist layer is isotropically plasma etched to laterally and controllably remove portions of the sidewalls, exposing a portion of the hard-mask film adjacent to the trenches. Since the sidewalls of the patterned first photoresist layer are aligned to the trenches in the second insulating layer, by virtue of the isotropic etch, the exposed regions of the hard-mask film are thereby also self-aligned adjacent to the trenches. The exposed hard-mask film is now etched anisotropically to the surface of the second insulating layer. The first photoresist layer is removed, for example, by plasma ashing in oxygen ($O_2$), and a second photoresist layer is now deposited and patterned for the purpose of forming T-shaped metal plug contact openings in the second insulating layer. The contact openings are formed over the trench areas where metal plugs are desired for electrically connecting the underlying first level of interconnecting lines. The openings in the photoresist layer are larger than the width of the hard-mask openings, thereby the patterned self-aligned hard mask serves as an etch mask for forming the T-shaped contact openings in the second insulating layer. The ground rules for aligning the patterned second photoresist layer can be relaxed since the hard-mask film serves to define the upper portions of the T-shaped plug contact openings. With the second photoresist mask still in place, the plug contact openings are now anisotropically and selectively plasma etched in the second insulating layer recessing further the trench portion in the second insulating layer to the surface of the first level of interconnections. The patterned hard-mask film serves as the self-aligned etch mask resulting in overlapping contact openings having a T-shape with vertical sidewalls, providing improved step coverage. The second photoresist layer is now removed by plasma ashing in oxygen and the remaining portions of the patterned hard-mask film composed of amorphous silicon are selectively removed, for example, by plasma etching in sulfur hexafluoride ($SF_6$). The planar interconnecting multilevel structure having T-shaped metal plugs is now formed by depositing a conformal second conducting layer that fills the T-shaped plug contact openings and the trenches in the second insulating layer. Preferably, the second conducting layer is composed of aluminum or an aluminum-copper (AlCu) alloy. Alternatively, other metallurgies such as refractory metals (tungsten (W), tantalum (Ta), molybdenum (Mo)), and the like can be used if the electrical resistance requirements are relaxed. For reducing electrical conductivity, copper can be used for interconnections and contact plugs. Typically a thin metal barrier layer such as titanium nitride (TIN) is used to prevent copper alloying. The second conducting layer is now chemical/mechanically polished to the surface of the second insulating layer, thereby completing the planar metal interconnections and the metal plugs on the semiconductor substrate. Although the method is described for forming a second electrically conducting level and plug to a first level of interconnecting metallurgy, it should be obvious to one skilled in the art that the method equally applies for making additional levels of interconnecting metallurgy.

BRIEF DESCRIPTION OF THE DRAWINGS

The objects and other advantages of this invention are best understood with reference to the preferred embodiments when read in conjunction with the following drawings.

DESCRIPTION OF THE PREFERRED EMBODIMENTS

The present invention relates to a method for fabricating planar electrical interconnections and metal plugs on semiconductor substrates for ULSI circuits. The method utilizes a single insulating layer in which the planar metal interconnecting lines and metal plugs are formed. The method also uses a controlled lateral etch-back of the first photoresist layer to form a self-aligned patterned hard-mask film which is then used to form a T-shaped metal plug. This improves the edge coverage and provides a more reliable interconnecting structure. Although the method is described for making a second metal level and metal plug structure contacting a first conducing level, it should be well understood by one skilled in the art that the method equally applies to additional levels of interconnections.

Figure 1:
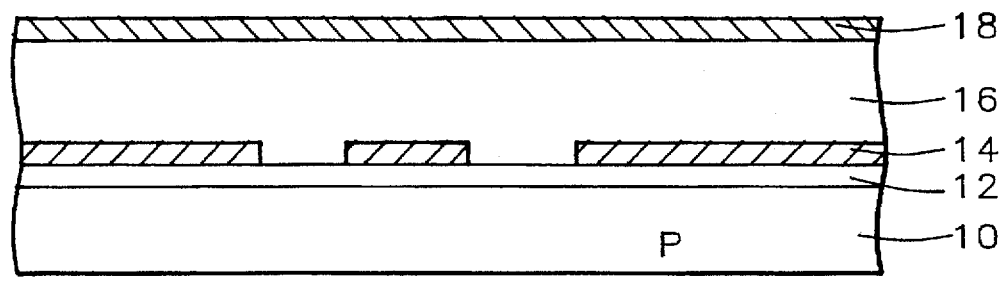
FIGS. 1 through 10 show schematic cross-sectional views for the sequence of process steps for making planar metal interconnections and metal plugs on a semiconductor substrate by the method of the present invention.

Starting with FIG. 1, a schematic cross-sectional view is shown of a portion of a semiconductor substrate 10. The most commonly used substrate in the semiconductor industry at the present time is composed of a single crystal silicon wafer having a surface with a <100> crystallographic orientation. The semiconductor devices are then formed in the silicon substrate 10 using conventional methods. For the purpose of this invention and to simplify the discussion, the semiconductor devices are not shown in the cross sections depicted in FIG. 1 or in subsequent figures. A first insulating layer 12 is deposited on the substrate 10 to electrically isolate the substrate and semiconductor devices from the next level of electrical interconnections. Typically the first insulating layer 12 is composed of a borophosphosilicate glass (BPSG) and is deposited using atmospheric pressure chemical vapor deposition (APCVD). The BPSG layer is then planarized by thermal annealing, or alternatively, by chemical/mechanical polishing (CMP). For example, the CVD oxide can be deposited using a reactant gas, such as tetraethosiloxane (TEOS) at a deposition temperature of between about 650° and 800° C. Preferably the silicon oxide layer 12 is deposited to a thickness between about 3000 and 8000 Angstroms. Contact openings are formed in layer 12 to provide contacts to the FET source/drain areas on the substrate 10 and to the underlying polysilicon layers. This provides contact openings for the next level of interconnections that are formed next. These contact openings are not shown in FIG. 1 in order to simplify the drawing and the discussion.

Still referring to FIG. 1, the first level of interconnections is formed by depositing a first conducting layer 14 on the insulating layer 12. The conducting layer 14 is typically the first metal layer and is composed of titanium/titanium nitride/tungsten/aluminum silicon copper (Ti/TiN/W/AlSiCu) where the Ti/TiN is used as a barrier metal layer and the Cu in the Al is used to improve the electromigration properties. The tungsten (W) can also be used to form metal plug contacts prior to forming the first conducting layer 14. This multilayer comprising the conducting layer 14 is depicted in FIG. 1 as a single layer. Alternatively, layer 14 can be composed of a $N^+$ or $P^+$ doped polysilicon layer having a silicide layer on the surface to further enhance the electrical conductivity for improved circuit performance. For example, a refractory metal silicide, such as tungsten silicide ($WSi_2$) can be used. Typically layer 14 has a total thickness of between about 5000 and 7000 Angstroms. Layer 14 is then patterned using conventional photolithographic techniques and plasma etching to provide the first level of electrical interconnections 14 for the devices. To simplify the drawing and discussion, the contact openings in layer 12 between the first conducting layer 14 and the device areas are not depicted in FIG. 1. Although polysilicon or polycide are commonly used, in some circuit applications, such as CMOS, DRAM, SRAM, and like circuits, the first level of interconnections can also be composed of a metal such as aluminum (Al) or aluminum-copper (AlCu) alloy. It is also common practice when using Al as the first level metallurgy that a barrier metal layer, such as tungsten (W) or titanium/tungsten (Ti/W) be used on the device contact areas to prevent aluminum spiking in the contacts.

Still referring to FIG. 1, a relatively thick second insulating layer 16 is deposited over the patterned first conducting layer 14. Layer 16 is preferably composed of silicon oxide ($SiO_2$) and is deposited by a low temperature chemical vapor deposition (CVD) using, for example, TEOS. The thickness of layer 16 as deposited is preferably between about 5000 and 10000 Angstroms. The second insulating layer 16 is now chemical/mechanically polished to provide global planarization (planarized across the substrate). Typically the polishing is carried out in a chem/mech polishing (CMP) system using a polishing slurry. The second insulating layer 16 is then polished to a thickness of between about 4000 and 8000 Angstroms.

Still referring to FIG. 1, after completing the chem/mech polishing to form the planar surface on the layer 16, a hard-mask film 18 is deposited. The hard-mask film 18 is preferably composed of a material having a significantly lower etch rate than the second insulating layer composed of silicon oxide. For example, the hard mask can be composed of amorphous silicon, polysilicon, or silicon nitride. The hard mask 18 will later serve as a patterned mask layer for selectively etching plug contact openings in the second insulating layer 16 having the T-shaped cross sectional profile. The preferred thickness of layer 18 is between about 500 and 2000 Angstroms.

Figure 2:
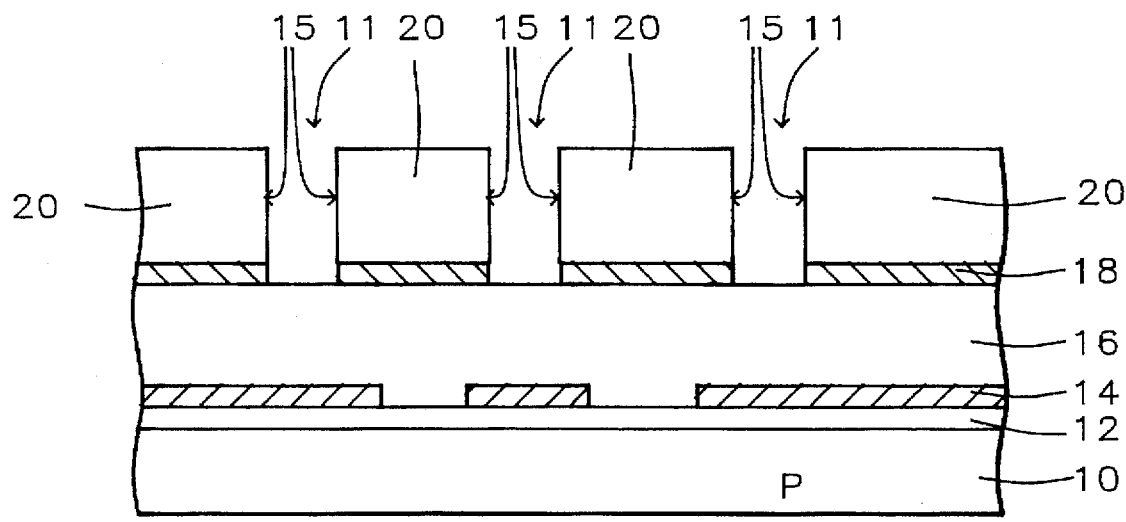

Now as shown in FIG. 2, a first photoresist layer 20 is spin-coated over the hard-mask film 18. The photoresist layer 20 is then patterned using conventional photolithographic techniques to provide open areas 11 along the regions where trenches are to be formed in the second insulating layer 16. These trenches are later filled with metal to form the second level of interconnecting metal lines. The openings 11 also extend over the patterned first conducting layer 14 where the T-shaped metal plug contacts are desired. Photoresist layer 20 is formed having essentially vertical sidewalls 15, as shown in FIG. 2. Using the patterned first photoresist mask layer 20, the hard-mask film 18 is patterned. Preferably the film 18 is patterned using anisotropic plasma etching, such as in a reactive ion etcher (RIE) or magnetically enhanced reactive ion etching (MERIE) using, for example, an etchant gas mixture of chlorine ($Cl_2$), hydrogen bromide (HBr), and sulfur hexafluoride ($SF_6$). This gas mixture can be used for etching the amorphous silicon, polysilicon, or silicon nitride hard mask.

Figure 3:
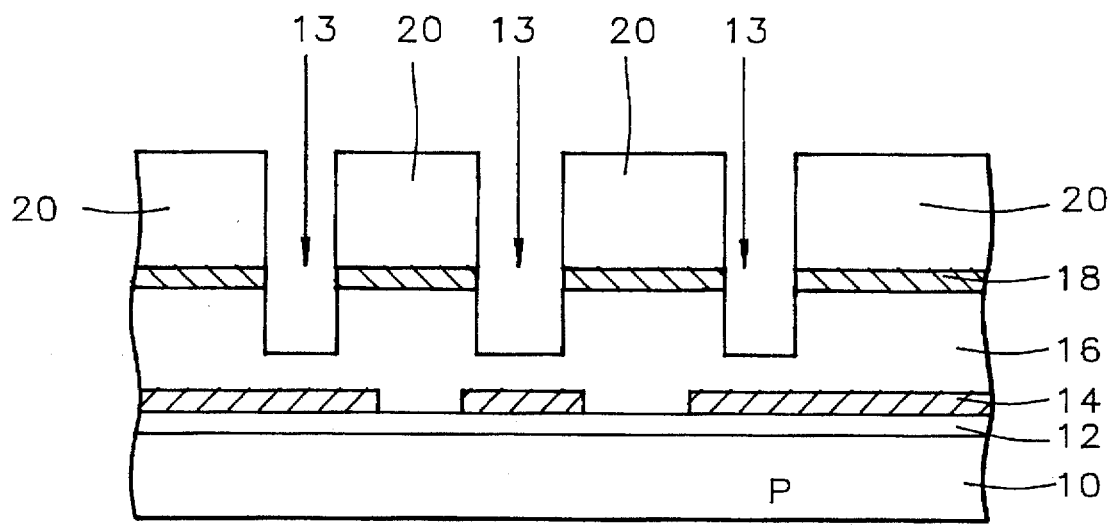

Continuing with the anisotropic plasma etching, as shown in FIG. 3, and with the patterned first photoresist layer in place, trenches are partially etched into the second insulating layer 16 to form the trenches 13 having essentially vertical sidewalls. Preferably the trenches are etched using reactive ion etching and an etchant gas mixture such as carbon tetrafluoride ($CF_4$) and trifluoromethane ($CHF_3$), and using a carrier gas such as argon (Ar). The trenches 13 are etched to a depth of between about 3000 and 5000 Angstroms into the second insulating layer 16.

Figure 4:
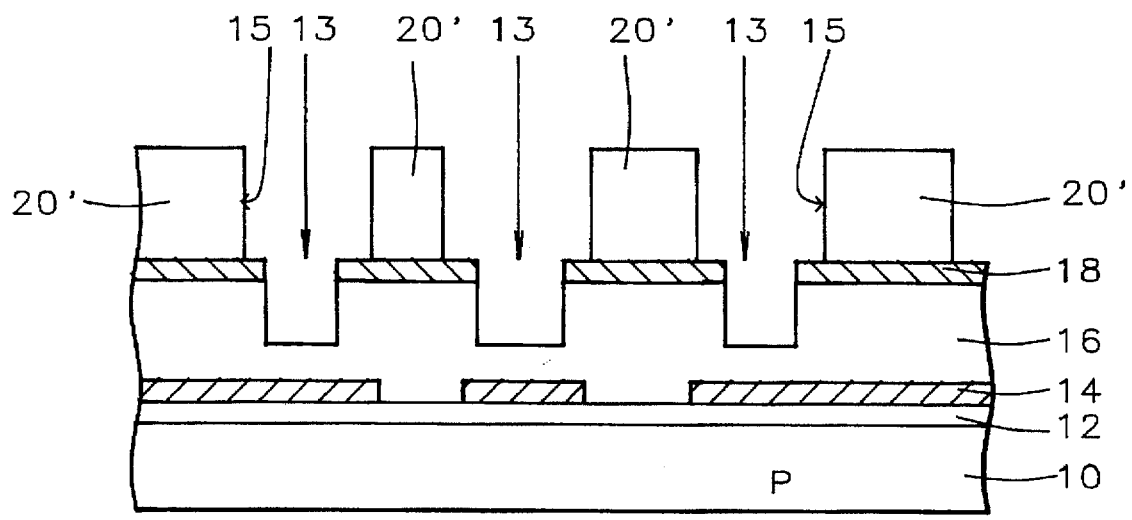

Referring to FIG. 4, the patterned first photoresist layer 20 is now isotropically plasma etched laterally to controllably remove a certain portion of the sidewall of the photoresist mask 20, and thereby expose a portions of the hard-mask film 18 adjacent to the trenches 13. This is a critical step in the invention because it defines the width at the top of the plug contact openings for forming the T-shaped metal contacts which are self-aligned to the trenches. These T-shaped plug contact openings being wider at the top provide a more gentle profile of the via hole, which improve the step coverage for the second metal deposition. The isotropic etching of the photoresist mask 20 is preferably carried out in a reactive ion etcher using oxygen ($O_2$) as the reactant gas. The laterally etched photoresist layer 20' is shown in FIG. 4.

Figure 5:
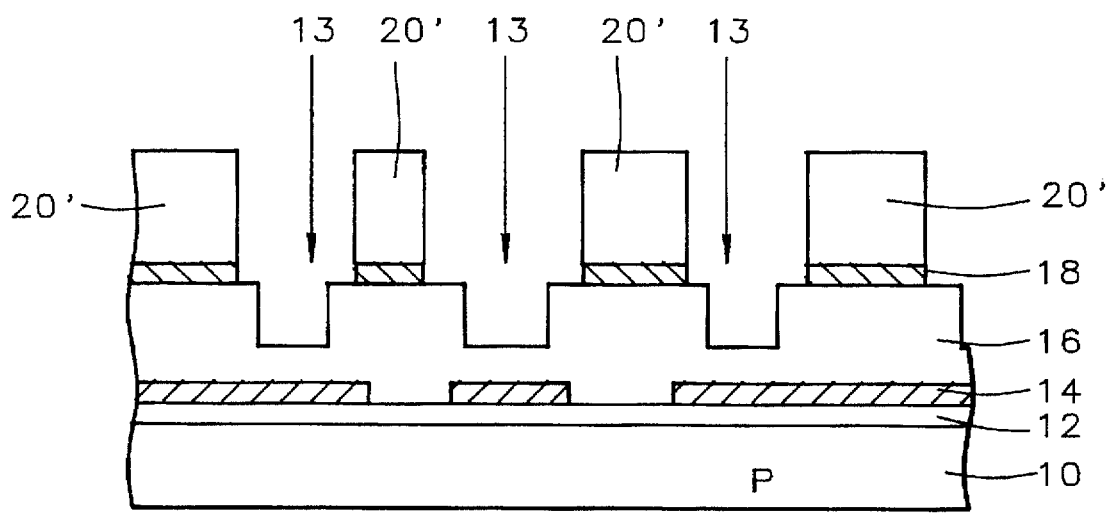

Now as shown in FIG. 5, the exposed hard-mask film 18 is etched anisotropically to the surface of the second insulating layer 16, using the same anisotropic plasma etch as above for initially patterning layer 18. The remaining first photoresist layer 20' is then removed, for example, by plasma ashing in oxygen ($O_2$).

Figure 6:
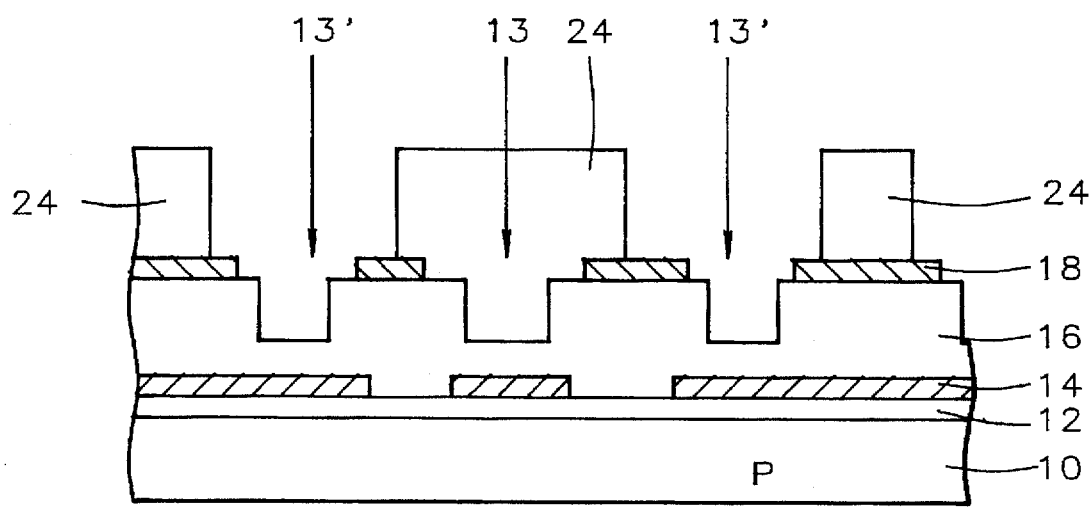

Referring to FIG. 6, a second photoresist layer 24 is deposited and patterned having openings over the trenches 13' wherein the T-shaped metal plug contact openings are to be formed while masking from etching the remaining portions of the trenches, such as shown in FIG. 6 for trench area 13. The openings in the photoresist layer 24 are designed to be larger than the width of the hard-mask openings, thereby the patterned self-aligned hard mask serves as the etch mask for completing the etching in the second insulating layer 16. Because the top of the T-shaped plug is determined by the patterned hard mask the ground rule alignment tolerance for the patterned second photoresist layer 24 can be relaxed.

Figure 7:
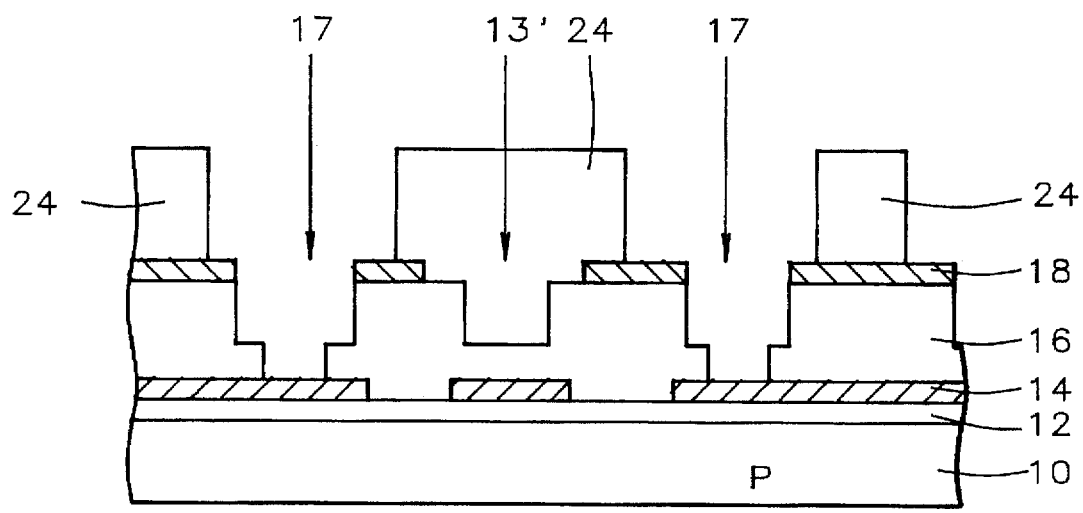

Now as shown in FIG. 7, with the patterned second photoresist 24 still in place, the plug contact openings 17 are now anisotropically and selectively plasma etched in the second insulating layer 16 further recessing the trench portion in the second insulating layer to the surface of the first level of interconnections. 14, as shown in FIG. 7. The patterned hard-mask film serving as the self-aligned etch mask results in the formation of self-aligned overlapping contact openings having a T-shape with vertical sidewalls.

Figure 8:
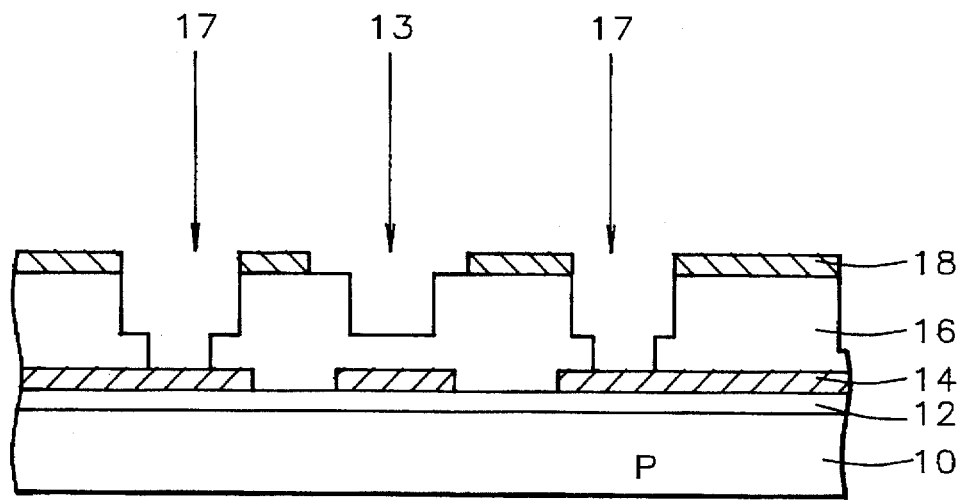

Referring to FIG. 8, the second photoresist layer 24 is removed, for example, by plasma ashing in oxygen ($O_2$). The remaining portions of the patterned hard-mask film 18 composed of amorphous silicon, polysilicon, or silicon nitride ($Si_3N_4$) are selectively removed. For example, the hard mask film can be removed by selectively plasma etching in sulfur hexafluoride ($SF_6$) gas.

Figure 9:
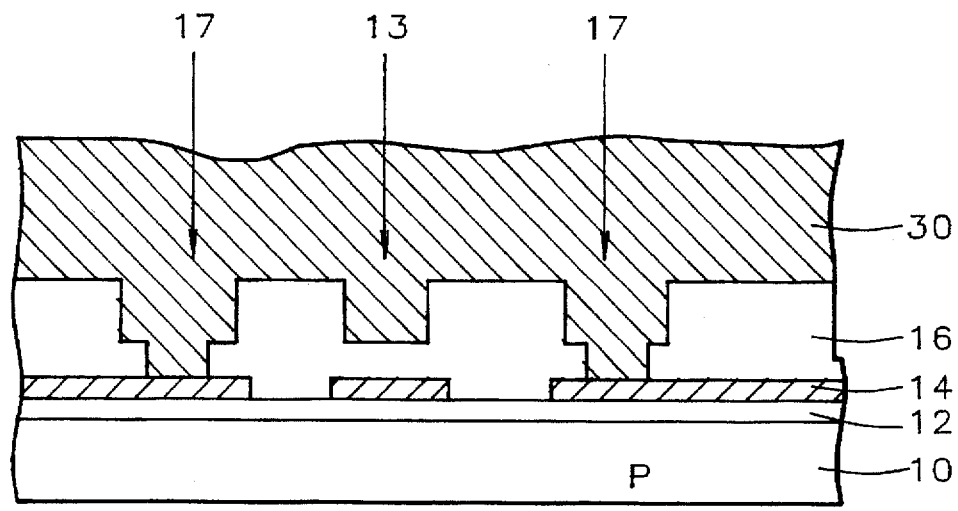

Now as shown in FIG. 9, a conformal second conducting layer 30 is deposited thereby filling the trenches 13 and the T-shaped plug contact openings 17. Layer 30 is preferably composed of aluminum. Since the T-shaped contact openings 17, by the method of this invention, are wider at the top it is easier to fill the submicrometer contact openings having high aspect ratios than the more conventional contact openings using conventional physical vapor deposition (PVD). However, to avoid voids from forming in the aluminum in the narrow contact openings the preferred method of depositing the aluminum is by chemical vapor deposition (CVD) through the thermal decomposition of triisobutyl aluminum (TIBA). Alternatively, these high aspect ratio-submicrometer contact openings can also be filled using more advanced techniques, such as the application of high pressure extruded aluminum as described by A. Dixit et al. entitled "Application of high Pressure Extruded Aluminum to ULSI Metallization," Semiconductor International, pages 79–86, August 1995. The second conducting layer 30 is preferably deposited to a thickness sufficient to fill the trenches 13 and the T-shaped plug openings 17, and more specifically to a thickness in the range of about 1500 to 5000 Angstroms.

Alternative metallurgies can also be used for the second conducting layer 30. For example, if very low resistivity metallurgy is not required, then one can also use a refractory metal such as tungsten (W), tantalum (Ta), molybdenum (Mo)). On the other hand, if a lower resistivity metallurgy is desired, to improve electrical conductivity one can use a copper metallurgy with a thin barrier layer such as titanium nitride (TiN) to provide the higher electrical conductivity. The TiN barrier prevents metallurgical reactions at the interface between the Cu metal plug and the first interconnection level interface.

Figure 10:
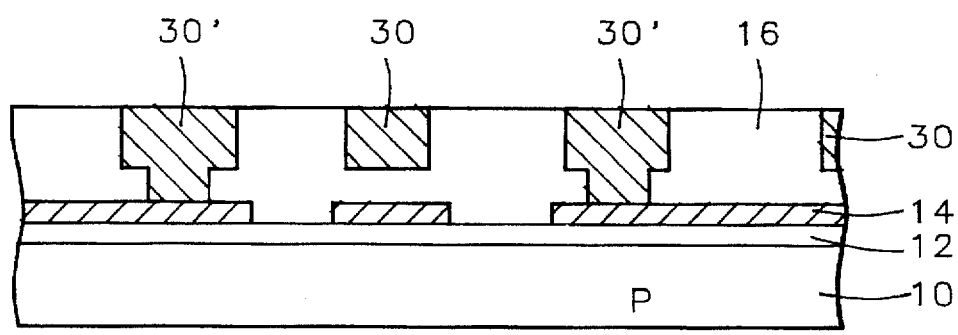

Referring to FIG. 10, the second conducting layer 30 is now chemical/mechanically polished back to the surface of the second insulating layer 16, thereby forming and completing the second level of interconnecting electrically conducting lines 30 having the T-shaped metal plug contacts 30'. Preferably the conducting layer 30 (FIG. 9) is polished back to layer 16 using a commercially available spin polisher and a polishing slurry. Alternatively, the second conducting layer 30 can be plasma etched back to form the second metal plugs 30' and conducting lines 30.

While the invention has been particularly shown and described with reference to the preferred embodiments thereof, it will be understood by those skilled in the art that various changes in form and details may be made without departing from the spirit and scope of the invention. In particular although the method is described for forming the planar second conducting level and T-shaped metal plug contacts to a first interconnecting conducting level the method is equally applicable to the additional levels of interconnecting metallurgy that are now being used on semiconductor integrated circuits.

What is claimed is:

1. A method for fabricating concurrently planar metal interconnections and metal plugs on a substrate comprising the steps of:

depositing a first insulating layer on said substrate;

depositing a first conducting layer on said first insulating layer;

patterning said first conducting layer forming a first level of interconnections;

depositing a second insulating layer on said patterned first conducting layer;

planarizing said second insulating layer;

depositing a hard-mask film as an etch stop layer;

coating a first photoresist layer on said hard-mask film;

patterning said first photoresist layer to form open regions having vertical sidewalls where said metal interconnections are desired;

anisotropic plasma etching in said openings removing said hard-mask film and partially etching into said second insulating layer forming trenches with vertical sidewalls;

isotropically plasma etching said first photoresist layer and thereby laterally and controllably removing portions of said sidewalls of said patterned first photoresist layer and exposing regions of said hard-mask film adjacent to said trenches, said regions being self-aligned to said trenches;

selectively removing portions of said exposed hard-mask film adjacent to said trenches in said second insulating layer;

removing said first photoresist layer;

depositing a second photoresist layer;

patterning said second photoresist layer forming openings for plug contact openings over said trench areas where metal plug contacts are desired to said patterned first conducting layer and said openings extending over and exposing the edge of said hard-mask film self-aligned to said trenches;

anisotropically and selectively plasma etching in said plug contact openings further recessing said trenches in said second insulating layer having vertical sidewalls aligned to said edge of said hard-mask film and said plug contact openings extending to said first conducting layer, thereby forming T-shaped plug contact openings;

removing said second photoresist layer;

removing remaining portions of said hard mask film;

depositing a conformal second conducting layer filling said T-shaped plug contact openings and said trenches elsewhere in said second insulating layer;

chemical/mechanical polishing said second conducting layer to the surface of said second insulating layer, thereby completing said planar metal interconnections and metal plugs on said substrate.

2. The method of claim 1, wherein said first insulating layer is a borophosphosilicate glass (BPSG) having a thickness of between about 3000 and 8000 Angstroms.

3. The method of claim 1, wherein said first conducting layer is a refractory metal polycide layer having a thickness of between about 5000 and 7000 Angstroms.

4. The method of claim 1, wherein said second insulating layer is planarized by chemical/mechanical polishing.

5. The method of claim 4, wherein said second insulating layer is composed of a CVD silicon oxide having a thickness of between about 4000 and 8000 Angstroms after chem/mech polishing.

6. The method of claim 1, wherein said hard-mask film is composed of amorphous silicon having a thickness of between about 500 and 2000 Angstroms.

7. The method of claim 1, wherein said trenches for said metal interconnections in said second insulating layer are etched to a depth of between about 3000 and 5000 Angstroms.

8. The method of claim 1, wherein said first conducting layer is composed of a multilayer of titanium/titanium nitride and an alloy of aluminum/copper/silicon having a thickness of between about 5000 and 7000 Angstroms.

9. The method of claim 1, wherein said lateral etching of said first photoresist layer is done in a plasma etcher using oxygen as the etching gas.

10. The method of claim 1, wherein said second conducting layer is deposited to a thickness of between about 1500 and 5000 Angstroms.

11. The method of claim 1, wherein said second conducting layer is composed of aluminum (Al).

12. The method of claim 1, wherein said chemical/mechanical polishing of said second conducting layer is carried out in a polishing slurry.

13. A method for fabricating concurrently planar metal interconnections and metal plugs on a semiconductor substrate for integrated circuits comprising the steps of:

providing a substrate having device areas;

depositing a first insulating layer on said substrate having contact openings to said device areas;

depositing a first conducting layer on said first insulating layer;

patterning said first conducting layer forming a first level of interconnections;

depositing a second insulating layer on said patterned first conducting layer;

planarizing said second insulating layer;

depositing a hard-mask film;

coating a first photoresist layer on said hard-mask film;

patterning said first photoresist layer to form open regions having vertical sidewalls where metal interconnections are desired;

anisotropic plasma etching in said openings removing said hard-mask film and partially etching into said second insulating layer forming trenches with vertical sidewalls;

isotropically plasma etching said first photoresist layer and thereby laterally and controllably removing portions of said sidewalls of said patterned first photoresist layer and exposing said hard-mask film adjacent to said trenches, said exposed hard-mask film self-aligned to said trenches;

selectively removing portions of said exposed hard-mask film adjacent to said trenches in said second insulating layer;

removing said first photoresist layer;

depositing a second photoresist layer;

patterning said second photoresist layer forming openings for plug contact openings over said trench areas where metal plug contacts are desired to said patterned first conducting layer and said openings also extending over and exposing the edge of said hard-mask film;

anisotropically and selectively plasma etching in said plug contact openings further recessing said trenches in said second insulating layer having vertical sidewalls aligned to said edge of said hard-mask film and said plug contact openings extending to said first conducting layer, thereby forming T-shaped plug contact openings;

removing said second photoresist layer;

removing remaining portion of said hard-mask film;

depositing a conformal second conducting layer filling said T-shaped plug contact openings and said trenches elsewhere in said second insulating layer;

chemical/mechanical polishing said second conducting layer to the surface of said second insulating layer, thereby completing said planar metal interconnections and metal plugs on said semiconductor substrate.

14. The method of claim 13, wherein said first insulating layer is a borophosphosilicate glass (BPSG) having a thickness of between about 3000 and 8000 Angstroms.

15. The method of claim 13, wherein said first conducting layer is a refractory metal polycide layer having a thickness of between about 5000 and 7000 Angstroms.

16. The method of claim 13, wherein said second insulating layer is planarized by chemical/mechanical polishing.

17. The method of claim 16, wherein said second insulating layer is composed of a CVD silicon oxide having a thickness of between about 4000 and 8000 Angstroms after chem/mech polishing.

18. The method of claim 13, wherein said hard-mask film is composed of amorphous silicon having a thickness of between about 500 and 2000 Angstroms.

19. The method of claim 13, wherein said trenches for said metal interconnections in said second insulating layer are etched to a depth of between about 3000 and 5000 Angstroms.

20. The method of claim 13, wherein said first conducting layer is composed of a multilayer of titanium/titanium nitride and an alloy of aluminum/copper/silicon having a thickness of between about 5000 and 7000 Angstroms.

21. The method of claim 13, wherein said isotropic and lateral plasma etching of said first photoresist layer is done in a plasma etcher using oxygen as the etching gas.

22. The method of claim 13, wherein said second conducting layer is deposited to a thickness of between about 1500 and 5000 Angstroms.

23. The method of claim 13, wherein said second conducting layer is composed of aluminum (Al).

24. The method of claim 13, wherein said chemical/mechanical polishing of said second conducting layer is carried out in a polishing slurry.

* * * * *